United States Patent
Campardo et al.

(10) Patent No.: US 6,643,179 B2
(45) Date of Patent: Nov. 4, 2003

(54) METHOD AND CIRCUIT FOR DYNAMIC READING OF A MEMORY CELL, IN PARTICULAR A MULTI-LEVEL NONVOLATILE MEMORY CELL

(75) Inventors: Giovanni Campardo, Bergamo (IT); Rino Micheloni, Turate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/047,918

(22) Filed: Jan. 14, 2002

(65) Prior Publication Data

US 2002/0149964 A1 Oct. 17, 2002

(30) Foreign Application Priority Data

Jan. 15, 2001  (EP) ............................................ 01830017

(51) Int. Cl.$^7$ .............................................. G11C 16/00
(52) U.S. Cl. .............................. 365/185.21; 365/185.03
(58) Field of Search ....................... 365/185.03, 185.21, 365/185.25, 207

(56) References Cited

U.S. PATENT DOCUMENTS

| 5,748,534 A | * | 5/1998 | Dunlap et al. | ......... 365/185.21 |
| 5,909,393 A | * | 6/1999 | Tran et al. | ............. 365/185.21 |
| 5,999,454 A | | 12/1999 | Smith | ..................... 365/185.21 |
| 6,034,888 A | | 3/2000 | Pasotti et al. | .......... 365/185.03 |
| 6,134,147 A | | 10/2000 | Kaneda | .................. 365/185.25 |
| 6,337,808 B1 | * | 1/2002 | Forbes | ................... 365/185.21 |
| 6,480,421 B2 | * | 11/2002 | Osama et al. | .......... 365/185.21 |

FOREIGN PATENT DOCUMENTS

EP       0 833 340 A1       4/1998

* cited by examiner

*Primary Examiner*—Tan T. Nguyen
(74) *Attorney, Agent, or Firm*—Lisa K. Jorgenson; Robert Iannucci; Seed IP Law Group PLLC

(57) ABSTRACT

The method for reading a memory cell is based upon integration in time of the current supplied to the memory cell by a capacitive element. The capacitive element is initially charged and then discharged linearly in a preset time, while the memory cell is biased at a constant voltage. In a first operating mode, initially a first capacitor and a second capacitor are respectively charged to a first charge value and to a second charge value. The second capacitor is discharged through the memory cell at a constant current in a preset time; the first charge is shared between the first capacitor and the second capacitor; and then the shared charge is measured.

23 Claims, 9 Drawing Sheets

METHOD AND CIRCUIT FOR DYNAMIC READING OF A MEMORY CELL, IN PARTICULAR A MULTI-LEVEL NONVOLATILE MEMORY CELL

BACKGROUND OF THE INVENTION

1. Field of the Invention

The present invention relates to a method and a circuit for dynamic reading of a memory cell, in particular a multi-level nonvolatile memory cell.

2. Description of the Related Art

As is known, the need for nonvolatile memories having increasingly larger densities has led to manufacturing multi-level memories wherein the information, stored as charge quantity in a floating-gate region, is encoded by fractioning the entrapped charge. In this way, the characteristic of a multilevel flash cell is described by a number of curves representing the pattern of the drain current Ids as a function of the gate voltage Vgs, each curve being associated to a different logic value. For example, FIG. 1 shows the characteristic of a four-level (2-bit) flash cell which stores the bits "11", "10", "01" and "00", corresponding to threshold voltages Vt1, Vt2, Vt3 and Vt4.

In fact, for a memory array comprising of a plurality of memory cells, the characteristics are no longer representable by a single straight line, but form distributions of different amplitude that are spaced apart by an amount sufficient to distinguish them from one another, as shown in 2 and 3, wherein FIG. 2 illustrates the distribution of the threshold voltages for an array of flash cells with 2 bits per cell, and FIG. 3 shows the corresponding distribution of characteristics.

Reading of multi-level cells is carried out evaluating the current or the voltage.

Current reading is based on comparing the current flowing in a cell at a preset gate voltage Vgs and the current flowing in a reference cell, the characteristic of which is intermediate between the distributions of the programmed cells, as shown in FIG. 3. The comparison is made after a current-to-voltage conversion, both of the current of the cell and of the reference current. Current reading requires the cell to absorb current, and hence the reading voltage Vr applied to the control gate terminal of the cell must at least be higher than the last but one threshold voltage (in the case of four levels, higher than Vt3).

Current reading has a number of problems, the main ones due to:

source resistance of the cell which, for cells belonging to the distribution "11" and because of the high current absorption, causes an undesired voltage drop, and thus to a cell gain variation;

drain-contact resistance, which causes an effect similar to the above;

resistance of the metal connections, which, in new fabrication processes, assumes an ever increasing importance; and resistance caused by the pass transistors of the column decoder.

As a whole, the result is a reduction in current dynamics. Consequently, the comparator that compares the voltages after current-to-voltage conversion must have a greater sensitivity. In addition, the actual characteristics differ with respect to the ideal ones, as shown in FIG. 4. In practice, the difference between the actual plot and the ideal plot in the array cells is all the greater, the higher the current absorbed by the cell. The characteristics of the reference cells are not modified in the same way, in that these cells may be designed so as to minimize the parasitic effects referred to above.

For example, consider a cell with a gain of 20 $\mu$A/V. If the cell is erased at 0.5 V, it absorbs a current of 110 $\mu$A at a gate voltage Vr=6 V, whereas if it has a threshold voltage of 5.5 V, it absorbs 10 $\mu$A.

In these conditions, the ideal current dynamics is 100 $\mu$A, and the distance between each reference current and the current of the nearest cell is 10 $\mu$A, whereas their distance, as regards the threshold voltage, is 0.5 V. The actual dynamics is instead reduced owing to the parasitic effects, which are typically approximately 20 $\mu$A. In order to compensate such effects, the distances of the reference curves from the cell curves are in general optimized so as to have minimum distances of 6–8 $\mu$A. However, this limits the number of levels storable in a single cell, owing to the difficulty in distinguishing characteristics that are very close to one another.

Suppose, in fact, that four bits are to be stored in a single memory cell. The voltage range including the characteristics remains the same as in the two-bit case (between 0.5 V and 6.5 V), for problems of reliability and operation, with a reading voltage Vr=6 V.

For simplicity, suppose a dynamics of 100 $\mu$A and sixteen equally spaced distributions. In these conditions, the sum of the width of a distribution and the distance from the next distribution is smaller than 7 $\mu$A. Setting the amplitude of each distribution equal to the distance between the distributions, each distribution is 3.5 $\mu$A wide and is at a distance of 3.5 $\mu$A from the adjacent distributions; the reference characteristic set between two distributions is at a distance of 1.75 $\mu$A from each of them. In real conditions, the sensitivity of the comparator must be approximately 1 $\mu$A.

In conclusion, reading of multi-level cells with more than two bits per cell becomes complex.

To overcome the above problems, U.S. Pat. No. 6,034,888, assigned to STMicroelectronics Srl, proposes a voltage reading method using a closed-loop circuit (see FIG. 5). In this circuit, the current of the cell to be read is compared with a reference current, and the gate voltage of the cell is modulated until reaching the equilibrium of the system. Thereby, the gate voltage of the cell reaches a value that can be defined as the threshold value of the cell.

However, also this solution is not free from problems, due to the need for an A/D converter able to read the voltage on the gate terminal of the cell, and to the constraint of not being able to read more than one cell at a time, since the row is in common to more than one cell and cannot assume different voltage values.

The solutions devised for solving the above problems moreover involve other disadvantages (increase in read time, greater area) and in any case call for the capacity to discriminate very small currents. On the other hand, the new technologies, involving a reduction in the cell dimensions, lead in turn to a reduction in the cell current, even though solutions are known for reducing the parasitic effects that determine the losses of linearity.

In practice, the new cells operate at ever smaller currents, even though the characteristics could be maintained parallel.

BRIEF SUMMARY OF THE INVENTION

An embodiment of the present invention provides a method and a circuit for reading multi-level memory cells, which operate properly even in the presence of low cell currents.

In practice, the invention is based on the integration in time of the electric charge supplied to a memory cell to be read through a charging step or discharging step of a capacitive element.

BRIEF DESCRIPTION OF THE SEVERAL VIEWS OF THE DRAWING(S)

For a better understanding of the present invention, preferred embodiments thereof are now described, purely to provide non-limiting examples, with reference to the attached drawings, wherein.

Figure 1:
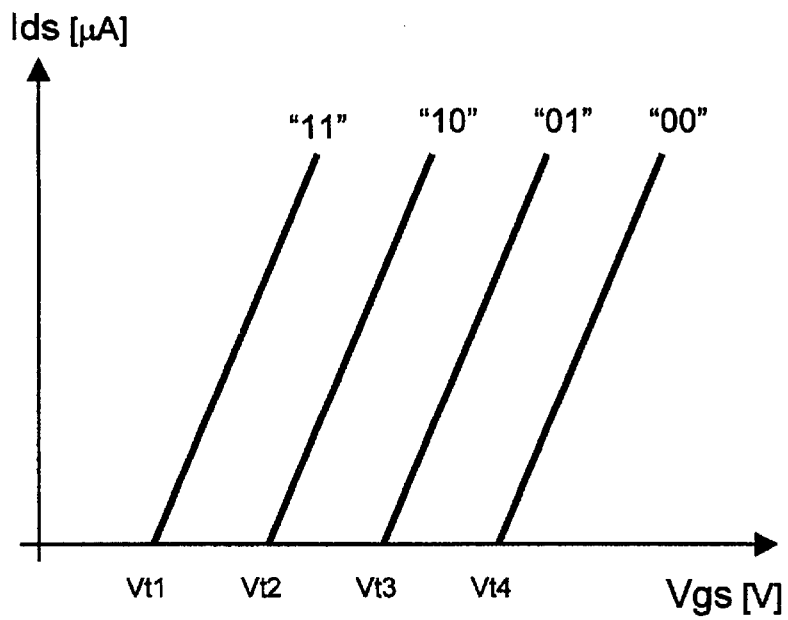
FIG. 1 shows the current-voltage characteristics of a two-bit flash memory cell.
Figure 2:
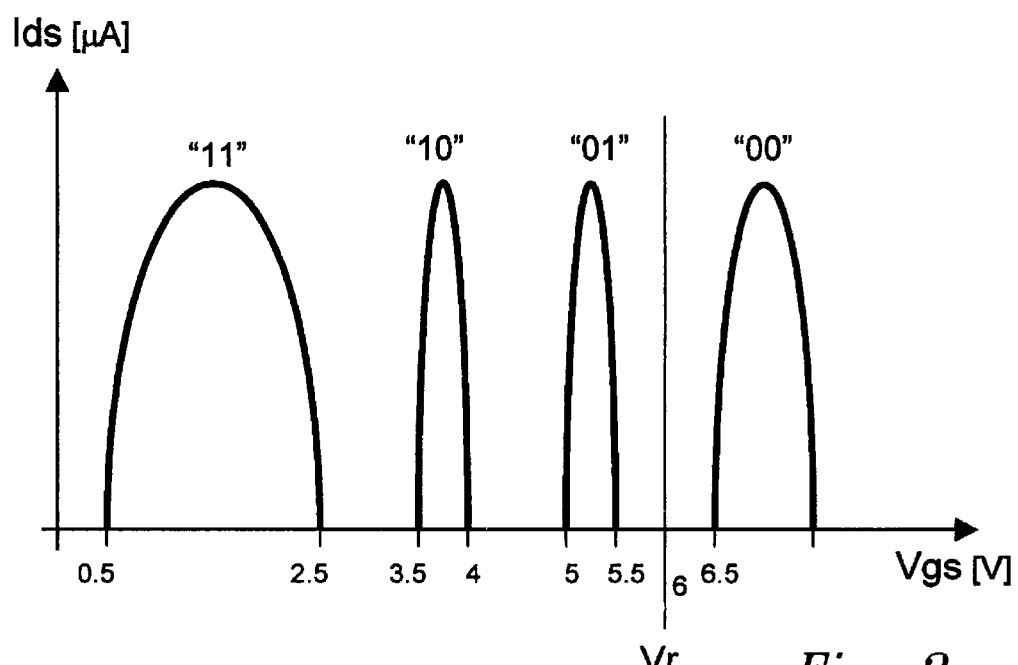
FIG. 2 shows the distribution of the threshold voltages for a two-bit flash memory cell.
Figure 3:
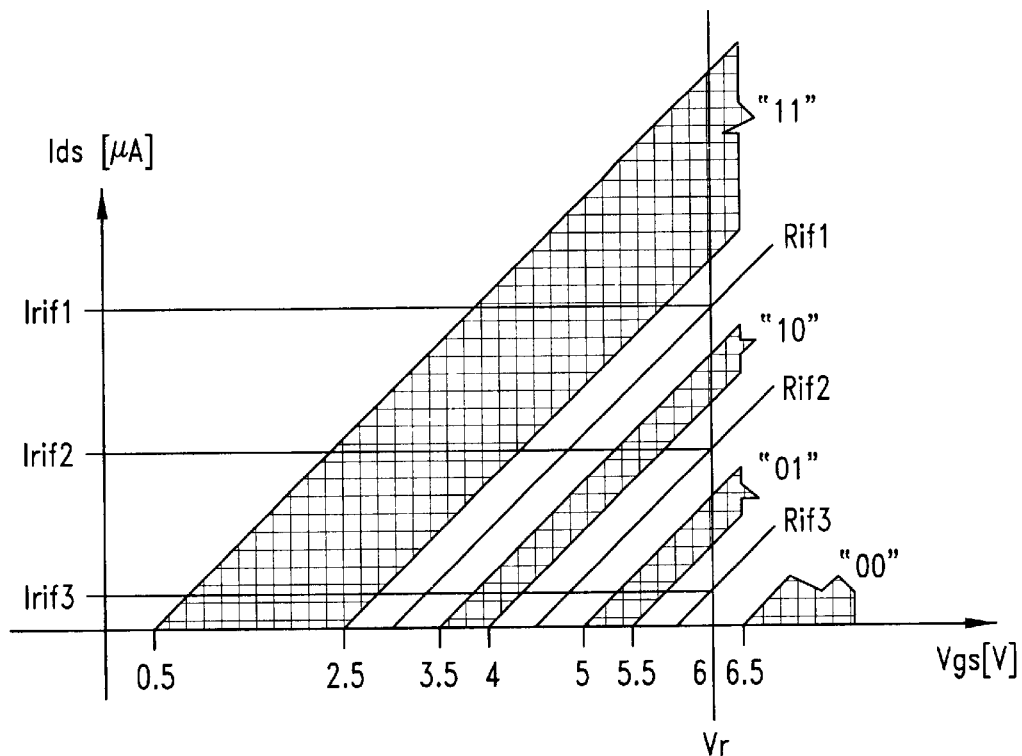
FIG. 3 shows the distribution of the characteristics of two-bit flash memory cells and of reference cells, for a current reading method.
Figure 4:
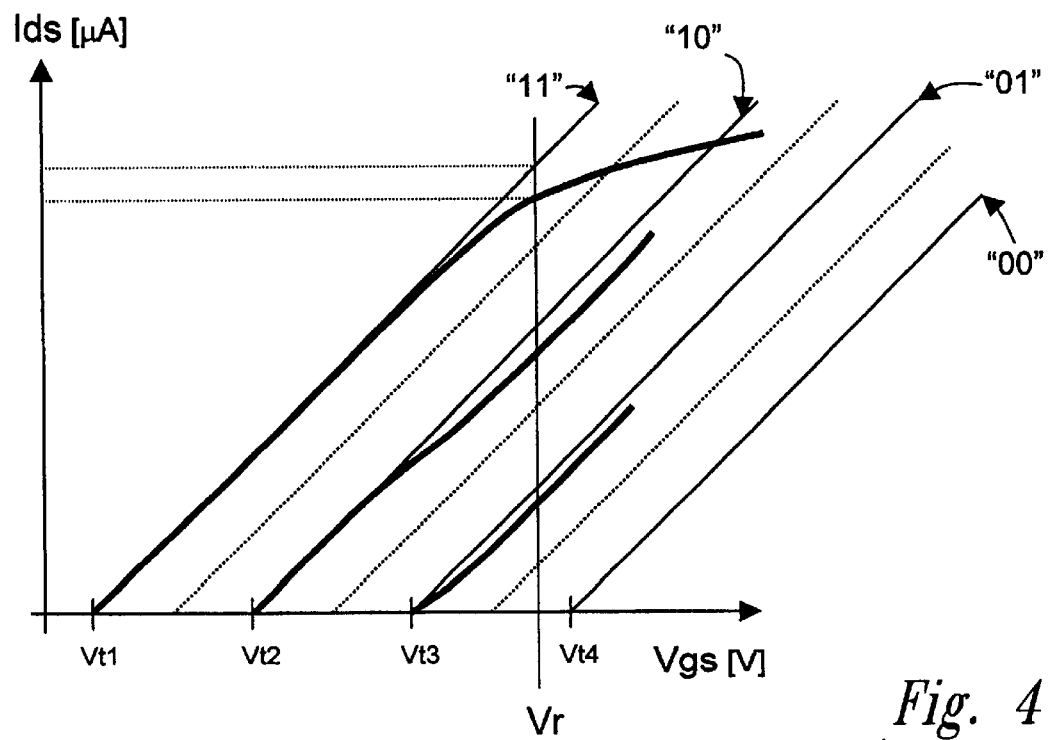
Figure 5:
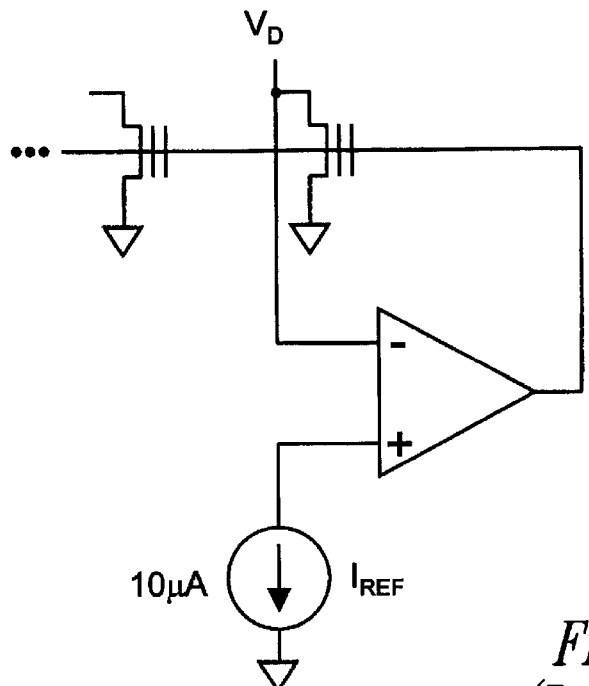
Figure 6:
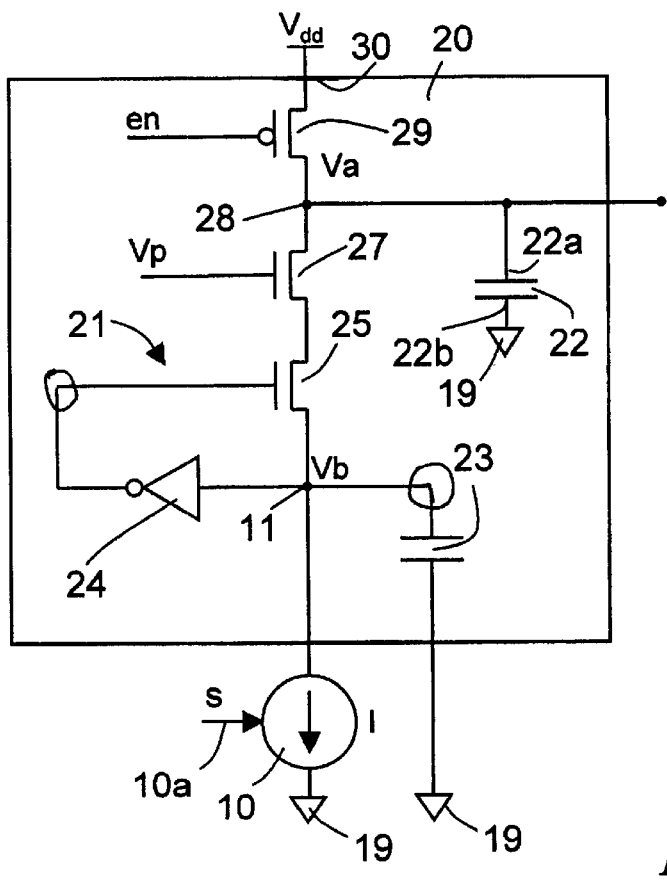
Figure 7A:
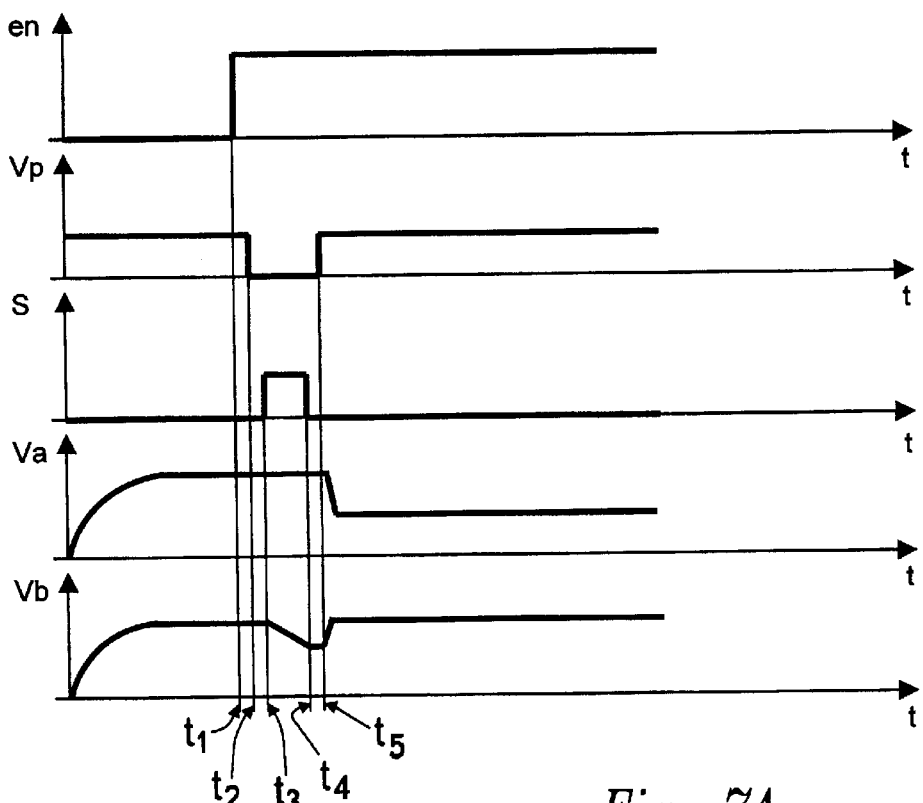
Figure 7B:
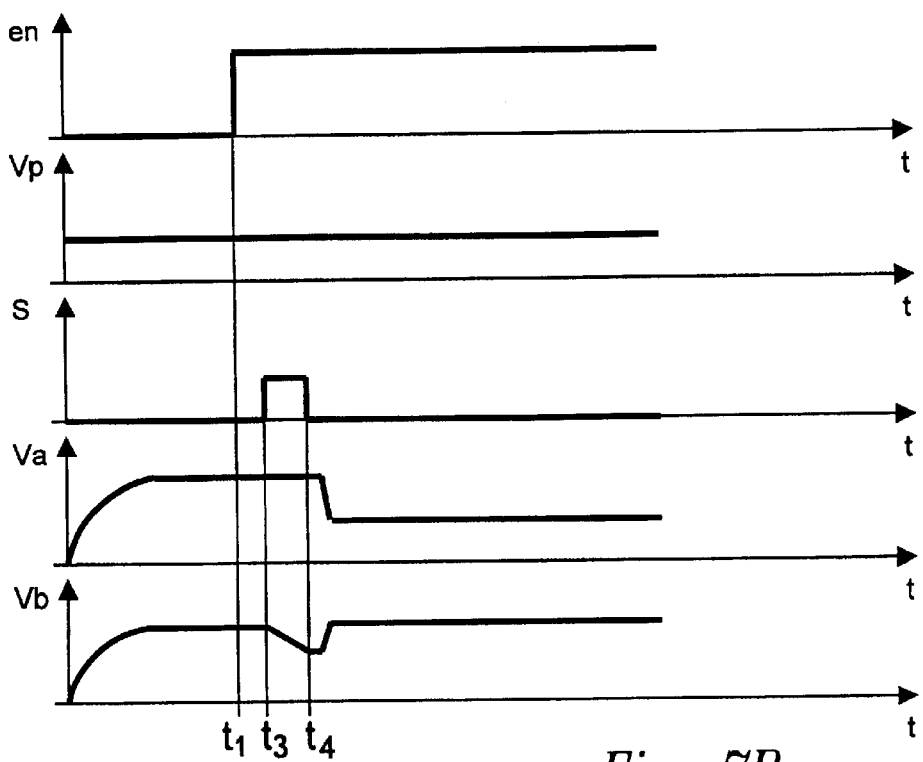
Figure 8:
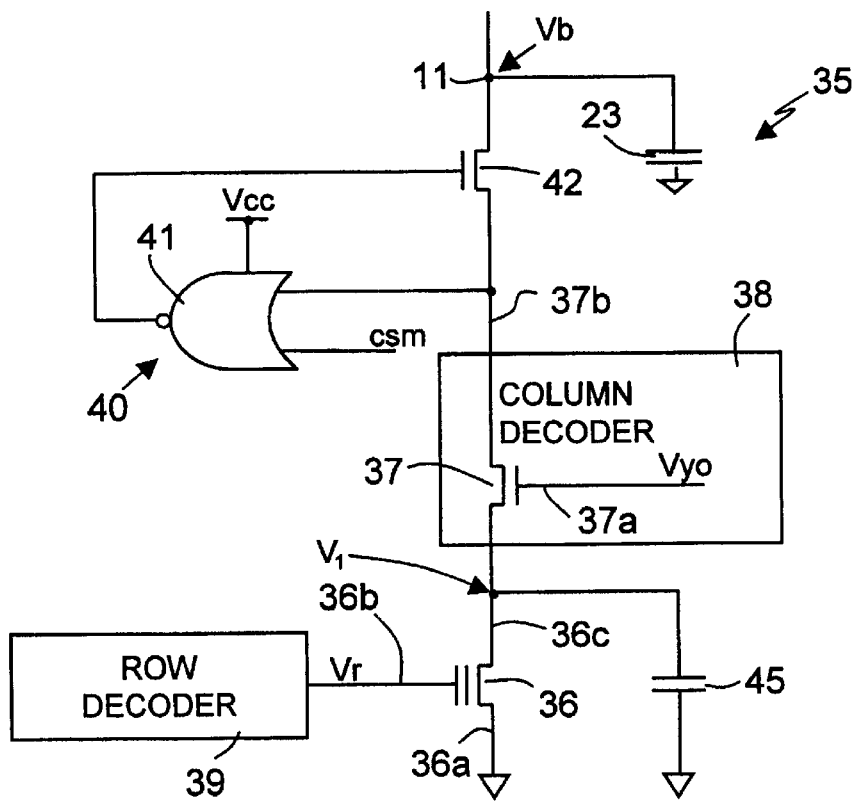
Figure 9:
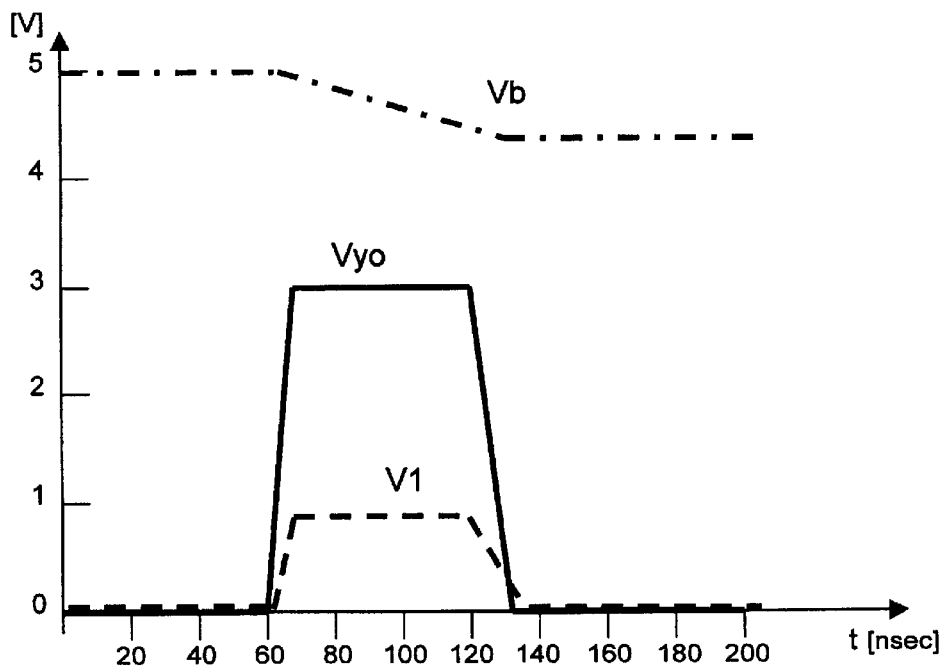
Figure 10:
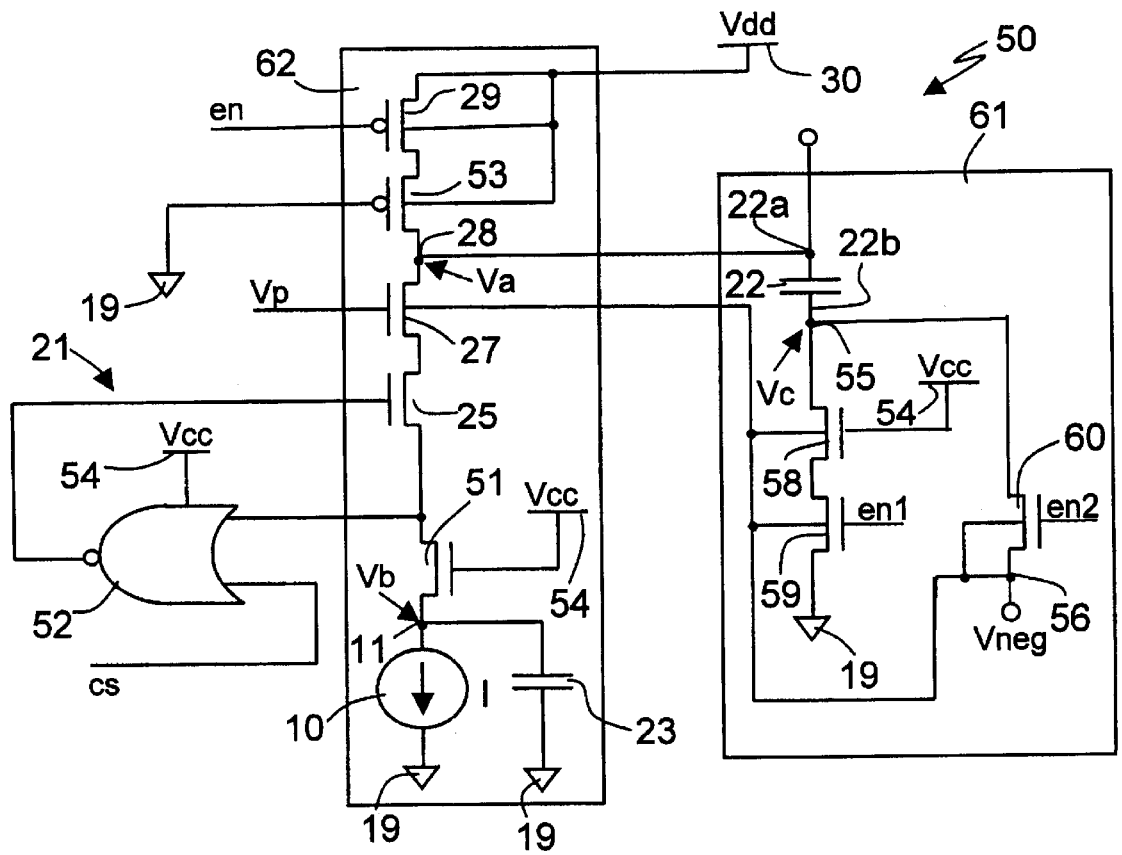
Figure 11:
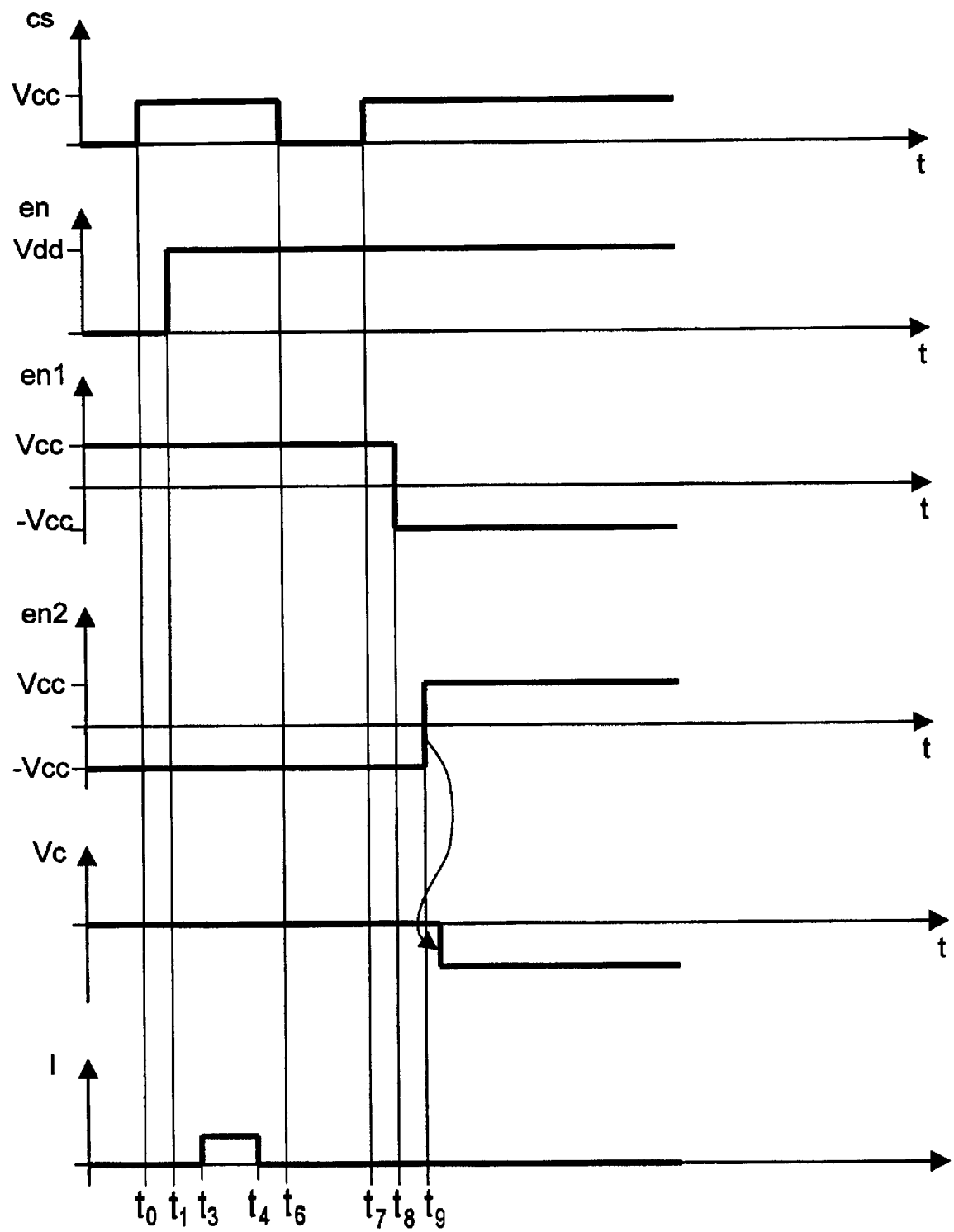
Figure 12:
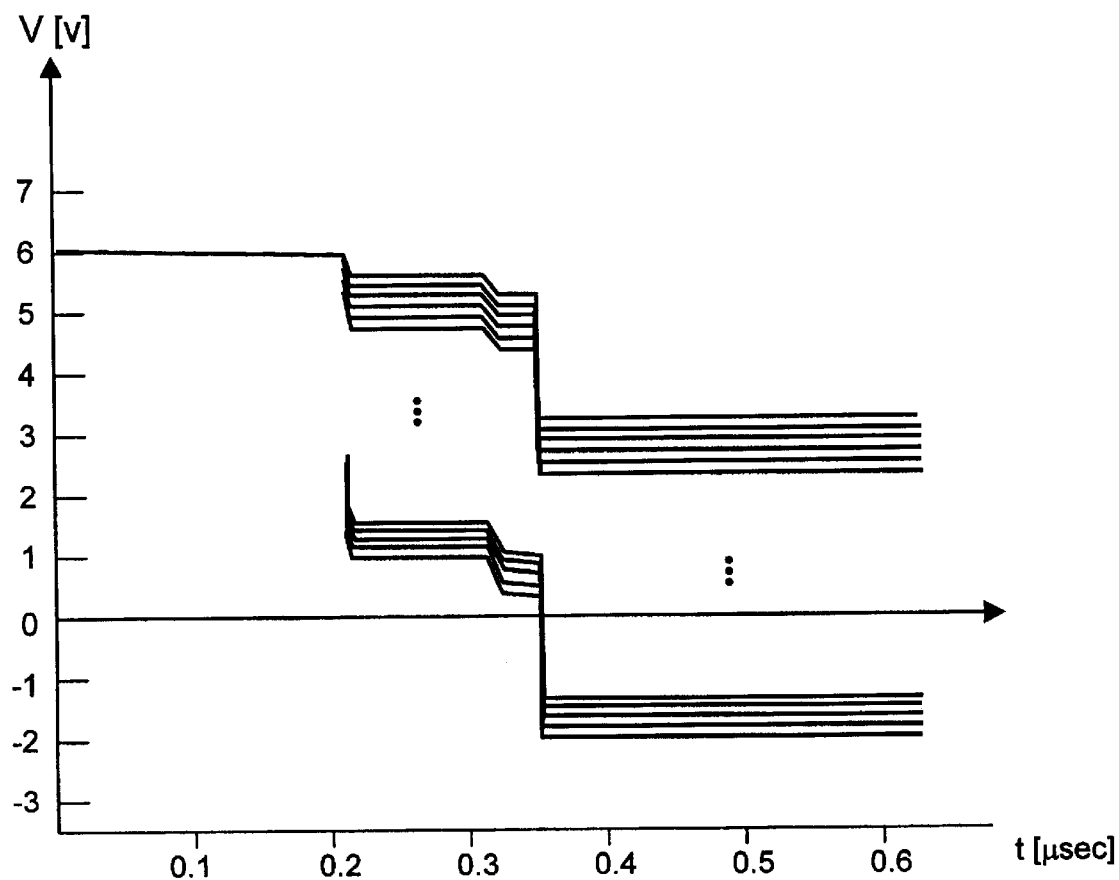
Figure 13:
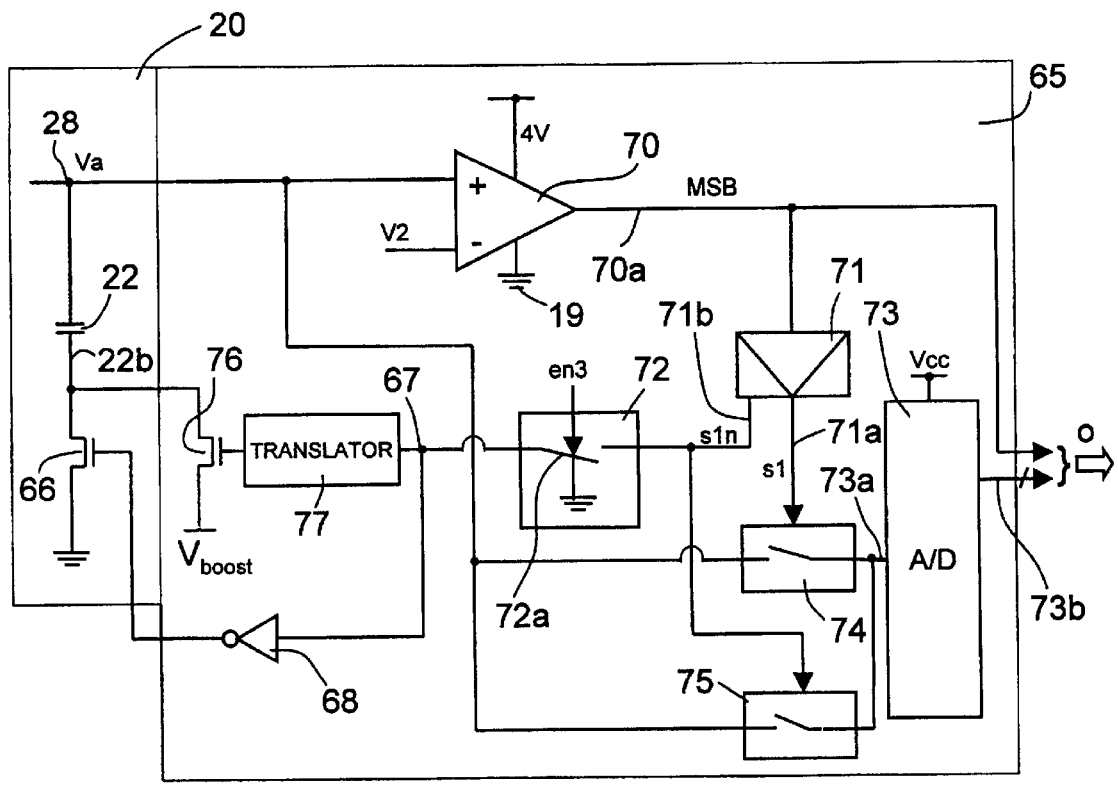
Figure 14:
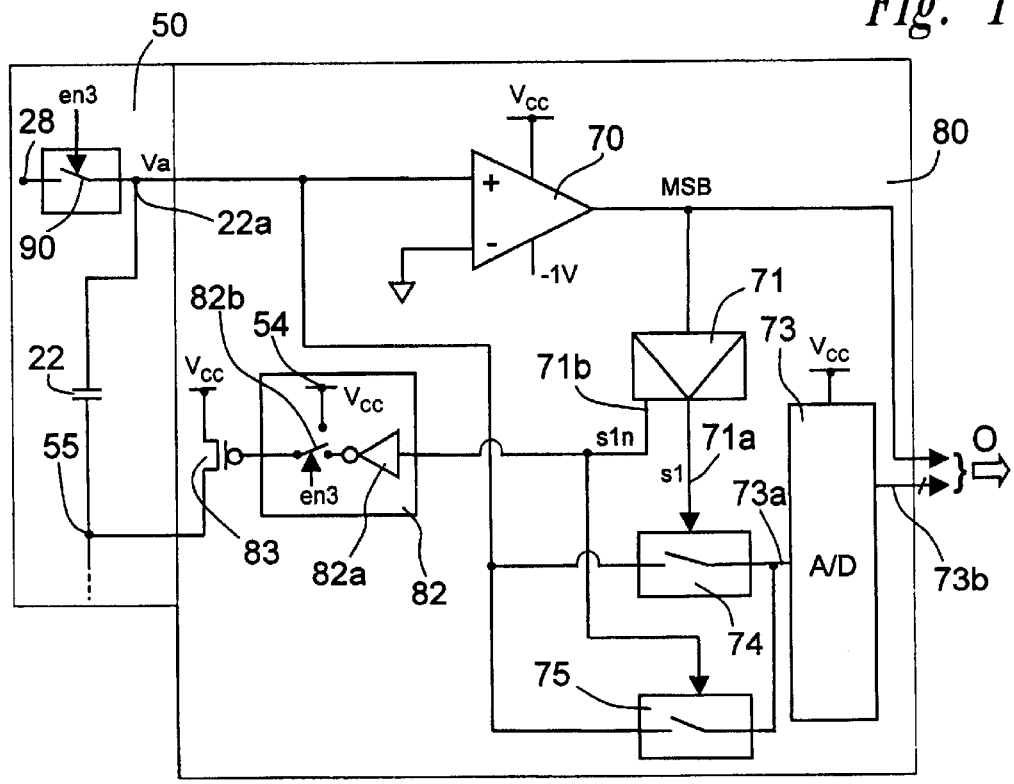

FIG. 4 presents the modification of the ideal characteristics of FIG. 1 due to parasitic effects;

FIG. 5 shows a known circuit for a voltage reading method;

FIG. 6 shows a simplified electrical diagram of a first embodiment of the reading circuit according to the invention;

FIG. 7a shows a first timing diagram of the circuit of FIG. 6;

FIG. 7b shows a second timing diagram of the circuit of FIG. 6;

FIG. 8 is an electrical diagram of a circuit including a memory cell which may be read with the reading circuit of FIG. 6;

FIG. 9 shows the plots of electrical quantities obtained in a simulation made for the circuit of FIG. 8;

FIG. 10 is an electrical diagram of a second embodiment of a reading circuit according to the invention;

FIG. 11 shows a timing diagram of the circuit of FIG. 10;

FIG. 12 shows the plots of electrical quantities obtained in a simulation made for the reading circuit of FIG. 10;

FIG. 13 shows a simplified circuit diagram of a first embodiment of a conversion circuit which may be used with the reading circuit according to FIG. 6; and FIG. 14 shows a simplified circuit diagram of a second embodiment of a conversion circuit which may be used with the reading circuit according to FIG. 10.

DETAILED DESCRIPTION OF THE INVENTION

In FIG. 6, a current source 10 is connected between a ground line or connection—hereinafter referred to as ground line 19—and a charge-transfer node 11 and has a control node 10a receiving a first control signal s. The current source 10 absorbs a constant current I directed towards the ground line 19, when enabled by the first control signal s. The charge-transfer node 11 is connected to a reading circuit 20 comprising a decoupling stage 21, a first capacitor 22 having a capacitance Ca, and a second capacitor 23 having a capacitance Cb.

In detail, the decoupling stage 21, formed by a circuit known as "cascode", comprises an inverting element, here an inverter 24, having an input connected to the charge-transfer node 11 and an output connected to the gate terminal of a cascode transistor 25, of NMOS type. The cascode transistor 25 moreover has a source terminal connected to the charge-transfer node 11 and a drain terminal connected to the drain terminal of a pass transistor 27, of NMOS type. The pass transistor 27 has a gate terminal receiving a second control signal Vp and a drain terminal connected to a charge-integration node 28.

The first capacitor 22 has a first terminal 22a connected to the charge-integration node 28 and a second terminal 22b connected to the ground line 19. The charge-integration node 28 is connected to the drain terminal of a charge transistor 29, of PMOS type. The charge transistor 29 has a source terminal connected to a supply line 30 set at the supply voltage Vdd and a gate terminal receiving a charge-enabling signal en.

Finally, the charge-integration node 28 forms the output of the reading circuit 20, and generates a voltage Va proportional, as will be explained hereinafter, to the current I flowing in the current source 10. A voltage Vb is present on the charge-transfer node 11.

According to a first aspect of the invention, operation of the circuit of FIG. 6 is the following (see also FIG. 7a).

Initially, the voltages Va and Vb on the charge-integration node 28 and on the charge-transfer node 11 are low. The first control signal s keeps the current source 10 off. In addition, the charge-enabling signal en is low and keeps the charge transistor 29 on. The second control signal Vp is high and keeps the pass transistor 27 on. In this condition, the output of the inverter 24 is high, and the cascode transistor 25 is on and enables charging of the second capacitor 23 up to the threshold voltage of the inverter 24. As soon as the voltage Vb on the charge-transfer node 11 has reached the triggering voltage of the inverter 24, the latter switches and turns off the cascode transistor 25, which interrupts charging of the second capacitor 23. In addition, the first capacitor 22 charges up to the supply voltage (i.e., until Va=Vdd).

In steady-state conditions, at the end of charging, the following relations apply:

$$V_{ai}=Vdd$$

$$Q_{ai}=C_a V_{ai}=C_a \; Vdd$$

$$Q_{bi}=C_b V_{bi}$$

where $V_{ai}$ is the value of the voltage $V_a$ at the end of the charging step, $Q_{ai}$ is the charge stored in the first capacitor 22, $V_{bi}$ is the value of the voltage $V_b$ at the end of the charging step, and $Q_{bi}$ is the charge stored in the second capacitor 23.

At the instant t1, the charge-enabling signal en switches to the high state (Vdd) and turns off the charge transistor 29 (in this way isolating the first capacitor 22 from the supply line 30). Next (instant t2), the second control signal Vp switches to low and turns off the pass transistor 27 (thereby isolating the charge-transfer node 11 and the charge-integration node 28). Finally (instant t3), the first control signal s switches and turns on the current source 10, which, to a first approximation, goes to a steady-state condition in a negligibly small time, so that the second capacitor 23 will not be affected by current transients.

Consequently, the second capacitor 23 discharges linearly, supplying the constant current I to the current source 10 through the charge-transfer node 11. At the instant t4, the control signal s switches again and turns off the current source 10, thus interrupting the discharging step. In practice, if Δt=t4−t3 is the time interval when the current source 10 is on, ΔVb is the voltage variation on the charge-transfer node 11 for the time interval Δt, and $\Delta Q_b$ is the charge supplied to the current source 10, ie., the charge lost by the second capacitor 23, we have $$V_{a,t3} = Vdd$$

$$V_{a,t3} = Vdd$$

$$I = C_b \frac{\Delta V_b}{\Delta t}$$

$$I\Delta t = C_b \Delta V_b = \Delta Q_b$$

$$\Delta V_b = \frac{I \Delta t}{C_b} = \frac{\Delta Q_b}{C_b}$$

For example, with $C_a$=0.5 pF and $C_b$=5 pF, the time interval Δt when discharging of the second capacitor 23 takes place is about 60 nsec.

Next (instant t5), the second control signal Vp switches again to high, turning on the pass transistor 27 and connecting together, through the decoupling stage 21, the charge-integration node 28 and the charge-transfer node 11. Consequently, the first capacitor 22 discharges rapidly to the second capacitor 23, re-integrating the charge lost by the latter, according to a charge-sharing process. In practice, the first capacitor 22 operates as a charge reservoir. However, the charge-integration node 28 and the charge-transfer node 11 do not assume the same potential. In fact, the decoupling stage 21 allows the charge-transfer node 11 to reach only the value of the triggering voltage of the inverter 24, after which the inverter 24 turns on the cascode transistor 25, thus once again isolating the charge-integration node 28 from the charge-transfer node 11. The charge-integration node 28, instead, goes to a voltage value $V_{af}$ given by the capacitive sharing between the second capacitor 23 and the first capacitor 22 (charge-sharing step).

At the end, in steady-state conditions, the final voltage on the first capacitor 22 is equal to $V_{af}$, the final charge of the first capacitor 22 is equal to $Q_{af}$, and the charge transferred from the first capacitor 22 to the second capacitor 23 is $\Delta Q_a$, equal to the charge $\Delta Q_b$ lost by the first capacitor (which has returned to the initial conditions). Consequently, we have $$V_{bf} = V_{b1-} *$$

$$V_{a,f} = \frac{Q_{af}}{C_a} = \frac{Q_{ai} - \Delta Q_a}{C_a} = \frac{Q_{ai} - \Delta Q_b}{C_a}$$

$$= \frac{C_a V_{ai} - I\Delta t}{C_a} = \frac{C_a Vcc - I\Delta t}{C_a}$$

and hence $$V_{a,f} = V_{cc} - \frac{I\Delta t}{C_a} \tag{1}$$

In practice, there exists a linear relation between the final voltage Va on the charge-integration node 28 and the current absorbed by the current source 10. Consequently, integrating the current absorbed by the current source 10 in a preset time interval (integration time Δt), the voltage Va on the charge-integration node 28 is proportional to the current I. Consequently, by appropriately sizing the integration time Δt and the capacitance Ca, the value of the current I, even if very small, can be converted into a voltage value (voltage Va) having an amplitude that may be read with present-day current circuits.

In addition, from Equation (1) it is possible to calculate the variation ΔVa of the voltage Va on the charge-integration node 28 generated by variations ΔI of the current of the current source 10. In fact, from Equation (1) it is $$\frac{\Delta V_a}{\Delta I} = -\frac{\Delta t}{C_a} \tag{2}$$

Relation (2) makes it possible to distinguish very small current variations from one another by measuring the voltage difference ΔVa that may be obtained on the charge-integration node 28.

For example, setting Δt=50 ns, if a variation ΔVa of 100 mV is desired for a current variation ΔI=1 μA, we obtain $$C_a = \frac{\Delta I}{\Delta V_{af}} \Delta t = 0.5 \text{ pF}$$

If it is desired a reduction of the voltage Vb on the charge-transfer node 11 of 0.5 V in 50 ns for a maximum current of 50 μA (which is assumed as being the maximum of the dynamics for the memory cell represented schematically by the current source 10), we have $$C_b = \frac{I \Delta t}{\Delta V_b} = 5 \text{ pF}$$

With this sizing we then obtain that, for each μA of variation in the current I of the current source 10, the voltage Va on the charge-integration node 28 varies by 100 mV, which can be detected without any problems.

According to a second aspect of the invention, measurement of the current flowing in the current source 10 (and hence in a memory cell) is performed dynamically. In fact, in the foregoing description, it is noted that the charge restored by the first capacitor 22 to the second capacitor 23 is equal to the charge lost by the second capacitor 23 in the discharging step. The charge transferred to the current source 10 could then be supplied directly by the first capacitor 22.

In detail, in this case, operation of the reading circuit 20 is the following (see also the timing diagrams of FIG. 7b, in which the instants in common with FIG. 7a are designated by the same subscripts). After the initial charging step (up to the time instant t1), the charge-enabling signal en switches to the high state. Then, without the pass transistor 27 being turned off (hence, with the second control signal Vp being kept high), the 'v' current source 10 is turned on (instant t3). In this situation, the current supplied by the first capacitor 22 to the current source 10 is obviously equal to the current I and is the same current that the first capacitor 22 should supply to the second capacitor 23 to bring it back to the initial conditions in the charge-sharing step according to FIG. 7a. In this situation, the second capacitor 23 is of no effect and, at the end of the time interval Δt, the value of the voltage Va on the charge-integration node 28 is equal to the value that the said voltage would assume at the end of the charge-sharing step.

FIG. 8 shows a circuit 35 that implements the current source 10 of FIG. 6 and comprises a memory cell 36.

In detail, a memory cell 36, in particular a nonvolatile memory cells such a flash cell, has a source terminal 36a connected to the ground line 19, a gate terminal 36b biased at a read voltage Vr via a row decoder 39 (shown only schematically), and a drain terminal 36c connected to the source terminal of a decoding transistor 37 belonging to a column decoder, which is shown only schematically. The read voltage Vr is typically equal to the supply voltage Vdd, for example 6 V.

The decoding transistor 37 has a gate terminal 37a receiving a column enable signal Vyo, and a drain terminal 37b connected to the charge-transfer node 11 through a biasing circuit 40 implemented by a controllable cascode circuit.

In detail, the biasing circuit 40 comprises a NOR gate 41 and a decoupling transistor 42. The NOR gate 41 has a first input receiving a turning-on signal csm, a second input connected to the drain terminal 37b of the decoding transistor 37, and an output connected to the gate terminal of the decoupling transistor 42. The decoupling transistor 42, which is of NMOS type, has a source terminal connected to the drain terminal 3b of the decoding transistor 37 and a drain terminal connected to the charge-transfer node 11.

FIG. 8 moreover shows a column capacitor 45 representing the capacitance associated to the bit line connected to the memory cell 36 and the second capacitor 23 of FIG. 6.

In the circuit 35 of FIG. 8 (see also FIG. 9), initially the gate terminal 36a of the memory cell 36 is biased at the read voltage Vr (for example, 6 V). Only after the gate terminal 36b has reached the steady-state value (which in current flash memories requires a few tens of nanoseconds) does the column enable signal Vyo switch from 0 V to a high value (in the example of FIG. 9, 3 V), so turning on the decoding transistor 37, which takes place in a few nanoseconds.

In this step, the turning-on signal csm is low and enables the biasing circuit 40. The latter, given its cascode structure, keeps the voltage on the drain terminal 37b of the decoding transistor 37 constant, and hence the voltage V1 on the drain terminal 36c of the memory cell 36 also constant, and approximately at 1 V, as shown also in FIG. 9. In these conditions, the memory cell 36 absorbs a constant current and the second capacitor 23 discharges linearly (see FIG. 9) as long as the column enable signal Vyo remains high. The circuit 35 thus effectively operates as a constant-current source and is equivalent to the source 10, with I being the current flowing through the memory cell 36; in addition, the column enable signal Vyo in practice implements the first control signal s of FIG. 6.

It is therefore evident that by associating a different storage level to each value of voltage Va detectable on the charge-transfer node 28, and hence to each value of current I flowing in the memory cell 34, it is possible to store a high number of bits in each cell. The same method can in any case be used for two-level memory cells in order to reduce the read time.

FIG. 10 shows a reading circuit 50 operating so as to shift the dynamics of the output voltage Va to lower values, for example to bring it down to between −Vdd/2 and +Vdd/2, where Vdd is the supply voltage used for charging the first capacitor 22. This is particularly advantageous when the reading circuit 50 is to be supplied at a first supply voltage Vdd generated by charge-pump circuits (not shown) starting from a second supply voltage Vcc lower than Vdd.

In the reading circuit 50 of FIG. 10, components that are the same as in the reading circuit 20 of FIG. 6 are designated by the same reference numbers. As for the reading circuit 20 of FIG. 6, then, the reading circuit 50 of FIG. 10 comprises a current source 10, a first capacitor 22, a second capacitor 23, a decoupling stage 21, a pass transistor 27, and a charge transistor 29.

In the embodiment of FIG. 10, a load transistor 51, of NMOS type, is connected between the charge-transfer node 11 and the source terminal of the cascode transistor 25, has a gate terminal connected to a second supply line 54 set at the second supply voltage Vcc, and is consequently always on. The load transistor 51 simulates the load of the column decoder. The decoupling stage 21 comprises, as inverting element, a NOR gate 52 having a first input connected to the drain terminal of the load transistor 51 and a second input receiving a third control signal cs and being supplied at the second supply voltage Vcc.

An auxiliary transistor 53, of PMOS type, is connected between the charge-integration node 28 and the drain terminal of the charge transistor 29. The auxiliary transistor 53, which has a gate terminal connected to the ground line 19 and is consequently always on, reduces the coupling between the first capacitor 22 and the charge-enabling signal en at when the charge transistor 29 turns off.

Here, the first capacitor 22 has the first terminal 22a connected to the charge-transfer node 28 and the second terminal 22b connected to a shift node 55, set at a voltage Vc. The shift node 55 is alternately connected to the ground line 19 or to a negative-voltage node 56 set at a negative voltage Vneg, for example equal to −Vcc. In detail, a first shift transistor 58 and a second shift transistor 59 are connected in series between the shift node 55 and the ground line 19. A third shift transistor 60 is connected between the shift node 55 and the negative-voltage node 56. All three shift transistors 58–60 are of NMOS type and have bulk terminals connected to the negative-voltage node 56. The shift transistors 58–60 form, together with the first capacitor 22, a shifting stage 61.

The first shift transistor 58 (operating as a cascode transistor) has a source terminal connected to the ground line 19, a gate terminal receiving a second measure biasing signal en1, and its drain terminal connected to the source terminal of the second shift transistor 59. The second shift transistor 59 has a gate terminal connected to the second supply line 54 and a drain terminal connected to the shift node 55.

The third shift transistor 60 has a drain terminal connected to the shift node 55, a source terminal connected to the negative-voltage node 56, and a gate terminal receiving a shift biasing signal en2.

The current source 10, the second capacitor 23, the decoupling stage 21, the pass transistor 27, the charge transistor 29, the load transistor 51, and the auxiliary transistor 53 form a main stage 62.

The pass transistor 27 has a bulk terminal connected to the negative-voltage node 56. The charge transistor 29 and the auxiliary transistor 56 have bulk terminals connected to the first supply line 30.

In the reading circuit 50, the first supply voltage Vdd is preferably 6 V, so that the voltage Va has a voltage dynamics of 5 V corresponding to a variation of 100 mV in the voltage Va on the charge-integration node 28 for each variation of 1 μA in the current I of the current source 10, with an end-scale value of 50 μA (as discussed previously).

Operation of the reading circuit 50 is described hereinafter (see also FIG. 11, where the instants in common with those of FIG. 7a are designated by the same subscripts).

Initially, the third control signal cs and the charge-enabling signal en are at 0 V. The measure biasing signal en1 is at Vcc, and the shift biasing signal en2 is at −Vcc. Consequently, the decoupling stage 21 is enabled, the charge transistor 29 is on, and the second terminal of the first capacitor 22 is set to ground. After switching of the second control signal Vp (not shown in FIG. 11), the measurement capacitor 22 and discharge capacitor 23 are charged, similarly to that described with reference to FIG. 7a.

At the instant t0, the third control signal cs switches to high (i.e., to Vcc), disabling the decoupling stage 21. Then (instant t1), the charge-enabling signal en switches to high (i.e., to Vdd), turning off the charge transistor 29. After switching of the first control signal s (again, not shown in FIG. 11) and the consequent activation of the current source 10, the latter absorbs a current I (which, as demonstrated, is equal to the current absorbed by a memory cell, and the value whereof depends upon the programming voltage of the cell-time interval t3-t4)

Next (instant t6), the third control signal cs switches to the low state (0V) again, re-enabling the decoupling stage 21. With the signal Vp being switched to high (in a way not illustrated), the charge-sharing step is activated, and hence the voltage Va on the charge-integration node 28 is reduced to the value given by Equation (1), as described with reference to FIG. 7a.

At the end of the charge-sharing step (instant t7), the third control signal cs switches to the high state again, turning off the decoupling stage 21 and isolating the current source 10. Then (instant t8), the measure biasing signal en1 switches to low (0V), turning off the second shift transistor 59 and separating the shift node 55 from the ground line 19. Next (instant t9), the shift biasing signal en2 switches to high (i.e., to Vcc), turning on the third shift transistor 60 which connects the shift node 55, and hence the second terminal 22b of the first capacitor 22, to the negative voltage Vneg, activating the voltage-dynamics shifting step.

The second terminal 22b of the first capacitor 22 thus shifted from the ground voltage (0V) to the negative voltage Vneg. In addition, due to charge conservation, the voltage Va on the charge-integration node 28 is also reduced by a value equal to Vneg, as shown (in part) also in the simulations of FIG. 12, for values of current I varying from 1 $\mu$A to 50 $\mu$A, with steps of 1 $\mu$A.

In practice, the dynamics of the voltage Va on the charge-integration node 28, which, on account of the charge sharing with the second capacitor 23, is between 0 V and 6 V, is brought back to between −3 V and +3 V.

FIG. 13 shows a converter circuit 65 which may be connected to the output of the reading circuit 20 of FIG. 6, and hence without shifting the voltage Va on the charge-integration node 28. The dynamics of the voltage Va thus ranges between Vdd (equal to 2 Vcc) and approximately 0 V.

FIG. 13 shows only the first capacitor 22 of the reading circuit 20 of FIG. 6, and the second terminal 22b of the first capacitor 22 is connected to the ground line 19 via a biasing switch 66 (instead of being connected directly, as in FIG. 6). The biasing switch 66 is here implemented by an NMOS transistor having a source terminal connected to ground, a drain terminal connected to the second terminal 22b of the first capacitor 22, and a gate terminal connected to a boost-control node 67 via an inverter 68.

The charge-transfer node 28 is connected to a non-inverting input of a comparator 70. The comparator 70 moreover has an inverting input receiving a comparison voltage V2 equal to one half the dynamics of Va (hence, equal to Vcc), a first supply input receiving a voltage greater than V2 (for example, 4 V), and a second supply input connected to the ground line 19. The output 70a of the comparator 70 is directly available to the outside and supplies a logic signal MSB representing the most significant bit of the analog-to-digital conversion. The output 70a of the comparator 70 is connected to a latch switch 71 having a first output 71a and a second output 71b on which a fourth signal s1 and a fifth signal s1n, opposite to one another, are respectively supplied.

The charge-transfer node 28 is moreover connected to an input 73a of an A/D converter 73 via a first and a second control switch 74, 75, connected in parallel. The first control switch 74 is controlled by the fourth control signal s1, and the second control switch 74 is controlled by the fifth control switch s1n, so that these switches are closed only one at a time. The A/D converter 73 converts an analog voltage comprised between 0 V and Vcc and supplies, on an output 73b, a corresponding digital signal, with a preset precision degree.

The second output 71b of the latch switch 71 is connected to a first enabling circuit 72 which connects the boost-enabling node 67 to the ground line 19 or to the second output 71b of the latch converter 71, according to the operating step. In the example illustrated, the first enabling circuit 72 comprises a changeover switch 72a controlled by a shift-enabling signal en3 which is also supplied (in a way not shown) to the other components of the conversion circuit 65. The boost-enabling node 67 is connected, via a voltage-shift circuit 77 (not shown in detail), to the drain terminal of a first boost transistor 76, of NMOS type. The first boost transistor 76 moreover has a drain terminal connected to the second terminal 22b of the first capacitor 22 and a source terminal receiving a boost voltage Vboost of −Vcc (here, −3 V). The well terminals of the first boost transistor 76 and of the NMOS transistor implementing the biasing switch 66 are appropriately connected, in a per se known manner, to prevent faulty operation.

Operation of the converter circuit 65 is the following. Initially, during the charging, discharging, and charge-sharing steps of the reading circuit 20, the converter circuit 65 is inactive (as a result of the shift-enabling signal en3), and the boost-enabling node 67 is at a low logic voltage, which, via the inverter 68 and the voltage-shifting circuit 77, keeps the biasing switch 66 closed and the first boost transistor 76 off.

At the end of the charge-sharing step, the shift-enabling signal en3 switches, connecting the second output 71b of the latch switch 71 to the boost-enabling node 67 and enabling the conversion circuit 65. Next, the comparator 70 compares the voltage Va on the charge-transfer node 28 with the voltage V2 and generates, on the output 70a, the logic signal MSB with a high logic value (equal to Vcc) or a low logic value (equal to 0 V) according to whether the voltage Va is higher or lower than the voltage V2. The latch switch 71 then generates the fourth control signal s1 and the fifth control signal s1n; precisely, the fourth control signal s1 is high and the fifth control signal s1n is low if the logic signal MSB is low (Va <V2), whereas the fourth control signal s1 is low and the fifth control signal s1n is high if the logic signal MSB is high (Va >V2).

In the former case (s1=1; s1n=0; voltage Va lower than the mean value), the first control switch 74 is closed and the second control switch 75 is kept open, so that the analog-to-digital converter 73 is supplied directly with the voltage Va on the charge-transfer node 28, and can immediately output a digital signal which, together with the logic signal MSB, constitutes an n-bit output signal O equivalent to the digital conversion of the voltage Va on the charge-transfer node 28. The low signal on the second output 71b of the latch switch 71 moreover keeps the biasing switch 66 closed and the first boost transistor 76 off.

In the latter case (s1=0; s1n=1; voltage Va higher than the mean value), the first control switch 74 is kept open and the second control switch 75 is closed. In addition, the high signal on the second output 71b of the latch switch 71 turns off the biasing switch 66 and turns on the first boost transistor 76. The boost voltage Vboost is thus supplied to the second terminal 22b of the first capacitor 22, causing a downshifting of the voltage Va on the charge-transfer node 28, similarly to the shifting step of FIG. 10. The voltage Va is then brought back to between 0 V and 3 V and is supplied, via the second control switch 75, to the A/D converter 73. In this step, an appropriate control signal disables the comparator 70. Also in this case, therefore, the digital signal on the output 73b of the A/D converter 73, together with the logic signal MSB, forms the digital output signal O.

FIG. 14 shows a conversion circuit 80 which can be connected to the output of the reading circuit 50 of FIG. 10, and thus when the voltage Va onto the charge-integration node 28 is shifted. The dynamics of the voltage Va hence ranges between Vcc and −Vcc.

FIG. 14 shows only the first capacitor 22 of the reading circuit 50 of FIG. 10; in this figure, components that are the same as those of the conversion circuit 65 of FIG. 13 are designated by the same reference numbers.

In FIG. 14, the inverting input of the comparator 70 is connected to ground. In addition, the comparator 70 has a first supply input connected to the second supply line 54 set at Vcc and a second supply input connected to a low-value negative voltage, for example −1 V.

The second output 71b of the latch switch 71 is connected, via a second enabling circuit 82, to the gate terminal of a second boost transistor 83, of PMOS type. The second enabling circuit 82 has the function of connecting the gate terminal of the second boost transistor 83 to the second supply line 54 set at Vcc or to the second output 71b of the latch switch 71, according to the operating step. In the example illustrated, the second enabling circuit 82 comprises an inverter 82a and a changeover switch 82b controlled by the shift-enabling signal en3, which, also in this case, is supplied (in a way not shown) to the other components of the conversion circuit 80.

The second boost transistor 83 has a source terminal connected to the second supply line 54 and a drain terminal connected to the shift node 55.

FIG. 10 does not show the shift transistors 58–60. However, like the biasing switch 66 and as will be explained in greater detail hereinbelow, these shift transistors are controlled so as to be turned off when the second boost transistor 83 intervenes.

Finally, a separation switch 90 is coupled between the charge-transfer node 28 and the first terminal 22a of the first capacitor 22; the separation switch 90, for example formed by a full CMOS pass transistor, is controlled by the shift-enabling signal en3 and separates the first capacitor 22 from the rest of the reading circuit 50 during the conversion step.

Operation of the conversion circuit 80 of FIG. 14 is described hereinafter.

Initially, during the charging, discharging, and charge-sharing steps of the reading circuit 50, the switch 90 is closed, the conversion circuit 80 is inactive (as a result of the shift-enabling signal en3), and the voltage Vcc on the gate terminal of the second boost transistor 83 keeps the second boost transistor 83 off.

At the end of the charge-sharing step, the shift-enabling signal en3 switches, opening the switch 90, connecting the second output 71b of the latch switch 71 to the gate terminal of the second boost transistor 83 and enabling the conversion circuit 80. Next, the comparator 70 compares the voltage Va on the charge-transfer node 28 with the ground potential and generates, on the output 70a, the logic signal MSB with a high logic value (equal to Vcc) or a low logic value (equal to 0 V) according to whether the voltage Va is higher or lower than 0 V. In this case, the latch switch 71 generates a high logic value for the fourth control signal s1 and a low logic value for the fifth control signal s1n if the logic signal MSB is high (Va>0 V), and vice versa.

When the voltage Va is positive (s1=1; s1n=0), the first control switch 74 is closed and the second control switch 75 is open, so that the analog-to-digital converter 73 is supplied directly with the voltage Va on the charge-transfer node 28, and can immediately generate on the output 73b a digital signal which, together with the logic signal MSB, constitutes an n-bit output signal O equivalent to the digital conversion of the voltage Va on the charge-transfer node 28. The low signal on the second output 71b of the latch switch 71 keeps the second boost transistor 83 off.

When the voltage Va is negative (s1=0; s1n=1), the first control switch 74 is open and the second control switch 75 is closed. In addition, the high signal on the second output 71b of the latch switch 71 turns on the second boost transistor 83 (and turns off the shift transistors 58–60, not shown). The voltage Vcc is then supplied to the second terminal 22b of the first capacitor 22, causing a upshifting of the voltage Va on the charge-transfer node 28; thus the voltage Va is brought back to a value of between 0 V and 3 V and is supplied, via the second control switch 75, to the A/D converter 73.

As an alternative to the above, the second transistor 83 may be absent, and, after generating the logic signal MSB, the shift transistors 58–60 could be controlled in such a way as to eliminate the shifting corresponding to −Vcc.

The advantages of the reading method and circuit described herein are illustrated hereinafter. First, the measure of the current flowing in a memory cell via time integration of the charge supplied to the memory cell allows a dynamic event involving electrical quantities that are directly scarcely detectable (the current in the memory cells) to be converted into quantities (the voltage Va) which can be measured without any difficulty.

This can be obtained without any need for current mirrors for bringing the memory cell current to other circuits that are able to detect it; in this way, it is possible to avoid the problems linked to dimensional variations and to the possible presence of parasitic components on the transfer path of the memory cell current, which for currents of the order of micro-amperes and for very short evaluation times (of the order of 100 ns) produce effects that are hard to evaluate, and hence macroscopic errors.

In particular, the present method enables reading of multilevel cells that store a high number of voltage levels set at short distances apart.

Finally, it is clear that numerous modifications and variations may be made to the reading method and circuit described and illustrated herein, all falling within the scope of the invention, as defined in the attached claims. In particular, the method described can be used for reading memory cells of a different type, whether volatile or non-volatile memory cells, for example memory cells of the flash, and two-level or multilevel types. The current I supplied to the memory cell and integrated for being converted into a more easily measurable quantity could be supplied, instead of by the discharge of the second capacitor 23 (or, in the variant dynamics, by the discharge of the first capacitor 22), by the charge of a capacitive element appropriately connected to the memory cell.

In addition, the decoupling circuit 21 can be made also in a different way, i.e., typically by feeding the cascode transistor 25 with a preset biasing voltage, which modulates the conductivity of this transistor also according to the voltage Vb present on its terminal which is connected to the memory cell (drain terminal), and hence eliminating the inverting element 24. In certain embodiments the pass transistor 27 may be absent.

We claim:

1. A method for reading a memory cell, comprising:
    supplying a current to said memory cell via a capacitive element; and
    integrating said current over time to produce a voltage corresponding to said current.

2. The method according to claim 1, wherein said steps of supplying a current and integrating comprise linearly discharging said capacitive element in a preset time.

3. The method according to claim 1, wherein said step of supplying a current comprises biasing said memory cell at a constant voltage.

4. The method according to claim 1, further comprising the steps of
    charging a first and a second capacitor respectively to a first and a second charge value;
    discharging said second capacitor through said memory cell at a constant current in a preset time;
    sharing said first charge between said first capacitor and said second capacitor; and
    measuring the shared charge.

5. The method according to claim 1, comprising the steps of:
    charging a first capacitor to a first charge value;
    discharging said first capacitor through said memory cell at a constant current in a preset time;
    measuring the charge supplied by said first capacitor to said memory cell.

6. The method according to claim 5, wherein said step of measuring comprises detecting a voltage present on said first capacitor.

7. The method according to claim 6, further comprising the step of shifting said voltage present on said first capacitor.

8. A device for reading a memory cell, comprising:
    a capacitive element;
    connection and biasing means connecting said capacitive element to said memory cell and supplying a constant current to said memory cell; and
    integration means integrating said current over time to produce a voltage corresponding to said current.

9. The device according to claim 8, wherein said integrating means comprise activation means activating said memory cell for a preset time, and measuring means measuring a voltage of said capacitive element.

10. The device according to claim 8, wherein the capacitive element includes first and second capacitors, the device further comprising a supply line, first switching means connected between said first capacitor and said supply line, second switching means connected between said first capacitor and said second capacitor, a constant-voltage biasing circuit connected between said memory cell and said second capacitor, and voltage-detecting means detecting a voltage on said first capacitor.

11. The device according to claim 10, wherein said first capacitor has a first and a second terminal; said second capacitor has a terminal; said first switching means are connected between said first terminal of said first capacitor and said supply line; said second switching means are connected between said first terminal of said first capacitor and said terminal of said second capacitor; said constant-voltage biasing circuit is connected between said memory cell and said terminal of said second capacitor; and said detecting means are connected to said first terminal of said first capacitor.

12. The device according to claim 11, wherein said second switching means comprise a cascode stage.

13. The device according to claim 12, wherein said cascode stage comprises:
    a first transistor having a first, a second, and a control terminal, said first terminal being connected to said first terminal of said first capacitor, and said second terminal being connected to said terminal of said second capacitor; and
    an inverting element having at least one input and one output, said input being connected to said terminal of said second capacitor, and said output being connected to said control terminal of said first transistor.

14. The device according to claim 11, wherein said constant-voltage biasing circuit comprises a cascode stage connected between said memory cell and said terminal of said second capacitor.

15. The device according to claim 14, wherein said cascode stage comprises:
    a second transistor having a first, a second, and a control terminal, said first terminal being connected to said terminal of said second capacitor, and said second terminal being connected to said memory cell; and
    an inverting element having at least one input and one output, said input being connected to said memory cell, and said output being connected to said control terminal of said second transistor.

16. The device according to claim 11, further comprising a reference-potential node and a shift-voltage node, said shift-voltage node being set at a lower potential than said reference-potential node, said second terminal of said first capacitor being connected to said reference-potential node and to said shift-voltage node respectively through a first shifting switch and a second shifting switch, alternately actuated.

17. The device according to claim 11, comprising a comparator having a first input connected to said first terminal of said first capacitor, a second input receiving a reference voltage, and an output; an analog-to-digital converter connected to said first terminal of said first capacitor through switching means; and a boost transistor having a first terminal connected to said second terminal of said first capacitor, a second terminal connected to a boost voltage, and a control terminal connected to said output of said comparator.

18. A device for reading a memory cell, comprising:
    a capacitive element structured to supply the memory cell with a current while the capacitive element is being discharged;
    a voltage sensing circuit structured to sense a sense voltage proportional to the current supplied to the memory cell; and
    an integrating switch connected to the capacitive element and connected between the memory cell and the voltage sensing circuit, the integrating switch having a first conduction terminal coupled to the voltage sensing circuit, a second conduction terminal coupled to the memory cell, and a control terminal coupled to the second conduction terminal.

19. The device of claim 18, further comprising an inverter having an input coupled to the second conduction terminal and an output coupled to the control terminal.

20. The device of claim 18 wherein the capacitive element includes first and second capacitors, the first capacitor being coupled at a sense node to the voltage sensing circuit and the first conduction terminal of the integrating switch, the second capacitor being coupled at a charge transfer node to the memory cell and the second conduction terminal of the integrating switch.

21. The device of claim 20, further comprising a pass transistor coupled between the first and second capacitors and structured to alternately electrically couple and decouple the first and second capacitors from each other.

22. The device of claim 18, further comprising a biasing circuit coupled between the integrating switch and the memory cell, the biasing circuit including a decoupling switch coupled between the integrating switch and the memory cell and an inverting element coupled between conduction and control terminals of the decoupling switch.

23. The device of claim 18, wherein the voltage sensing circuit includes a comparator connected between the integrating switch and a first output at which a most significant bit is produced and an analog/digital converter connected between the integrating switch and a second output at which a least significant bit is produced.

* * * * *